United States Patent [19]
Huang

[11] Patent Number: 6,156,460
[45] Date of Patent: Dec. 5, 2000

[54] PHOTO-MASK AND METHOD OF FABRICATING THE SAME

[75] Inventor: Chao-Yuan Huang, Hsinchu, Taiwan

[73] Assignee: United Microelectronics Corp., Taiwan

[21] Appl. No.: 09/010,136

[22] Filed: Jan. 21, 1998

[30] Foreign Application Priority Data

Dec. 1, 1997 [TW] Taiwan ................................. 86118025

[51] Int. Cl.$^7$ .................................................... G03F 9/00
[52] U.S. Cl. ............................................................ 430/5
[58] Field of Search ............................... 430/5, 322, 323, 430/311; 428/210, 446

[56] References Cited

U.S. PATENT DOCUMENTS

| 4,764,432 | 8/1988 | Kalbitzer | 430/5 |
| 5,213,916 | 5/1993 | Cronin et al. | 430/5 |
| 5,725,975 | 3/1998 | Nakamura et al. | 430/5 |
| 5,936,707 | 8/1999 | Nguyen et al. | 355/18 |

*Primary Examiner*—S. Rosasco
*Attorney, Agent, or Firm*—Rabin & Champagne, PC

[57] ABSTRACT

A photo-mask and a method of fabricating the same. A photo-mask comprises a quartz glass substrate, on which a clear area, a grey area, and a dark area formed over the quartz glass substrate. Incident light penetrates through the clear area completely, but only part of the incident light will go through the grey area since the other part of the incident light is absorbed by the grey area, On the other hand, incident light is blocked by the dark area completely.

7 Claims, 8 Drawing Sheets

PHOTO-MASK AND METHOD OF FABRICATING THE SAME

CROSS-REFERENCE TO RELATED APPLICATION

This application claims the priority benefit of Taiwan application serial no. 86118025, filed Dec. 1, 1997. the full disclosure of which is incorporated herein by reference.

BACKGROUND OF THE INVENTION

1. Field of the Invention

The invention relates to a method of fabricating multilevel interconnections of a semiconductor device, and more particularly to a method of fabricating a via and an interconnection.

2. Description of the Related Art

As the integration of semiconductors is enhanced, the dimensions of devices cannot supply enough area for interconnection. To match the requirements of the metal oxide semiconductor (MOS) devices with smaller dimensions, designs of multilevel interconnections are adapted in most of the integrated circuits (ICs). Normally, an inter-metal dielectric (IMD) layer is used to isolate two conductive layers. By the formation of a via plug, the conductive layers are electrically connected.

There are two conventional methods of fabricating a via and an interconnection. One is to fabricate a via and an interconnection in two steps. That is, a dielectric layer is formed on a metal layer first. Using an etching technique to form a via hole, and a via plug is formed by filling the via hole with conductive material. Another metal layer is formed and defined. An inter-metal dielectric layer is then deposited. Another method is to use damascene technique. A via and an interconnection is formed simultaneously. Two steps to define photo-resist are required in the conventional damascene technique. The process is very complicated and is described as follows.

Referring to FIG. 1A to FIG. 1I, processes of conventional damascene technique are shown. Referring to FIG. 1A, a first metal layer 12 is formed on a substrate 10 comprising a metal oxide semiconductor (MOS) device. An inter-metal dielectric layer 14 is formed on the metal layer.

Referring to FIG. 1B, a first photo-resist layer 16 is formed and defined to expose a predetermined region of a via. Referring to FIG. 1C, a second photo-resist layer 26 is formed and defined on the first photo-resist layer 16 to expose a predetermined region of an interconnection. The material of the first photo-resist layer 16 and the material of inter-metal dielectric layer 14 are similar, whereas, the material of the second photo-resist layer 26 is different from the material of the inter-metal dielectric layer 14. Thus, the etching rate of the first photo-resist layer 16 is similar to the etching rate of the inter-metal dielectric layer 14, whereas, the etching rate of the second photo-resist layer 26 is slower than the etching rate of the inter-metal dielectric layer.

Referring to FIG. 1D, using the first photo-resist layer 16 as a mask, the inter-metal dielectric layer 14 is dry etched to form a prototype of a via hole. Meanwhile, using the second photo-resist layer 26 as a mask, the first photo-resist layer 16 is etched to expose the inter-metal dielectric layer 14. The first photo-resist layer 16 and the second photo-resist layer 26 are then combined into one photo-resist layer 36.

Referring to FIG. 1E, using the combined photo-resist layer 36 as a mask, a dry etching step is performed continuously until the via hole a and the interconnection window b are formed to expose the first metal layer 12.

Referring to FIG. 1F, after removing the first photo-resist layer 36, a thin barrier layer 18 conformal to the inter-metal dielectric layer 14 is formed over the substrate. The formation of the barrier layer 18 enhances the adhesion between the subsequent deposited metal and other materials.

Referring to FIG. 1G, a metal layer 22 is formed and fills the via hole a and the interconnection window b shown on FIG. 1E. Using chemical-mechanical polishing (CMP), a step of etching back is performed until parts of the inter-metal dielectric layer 14 are exposed. The exposed parts of the inter-metal dielectric layer 14 are noted as isolation regions c. A via plug 22a and an interconnection 22b are formed as shown on FIG. 1H. Referring to FIG. 1I, by repeating the steps shown on FIG. 1A to FIG. 1G, another level of interconnections is formed.

As described above, in the conventional damascene, a via and an interconnection are formed at the same time. Two steps of photolithography process are required to define two different levels of photo-resist layers. Therefore, the process is very complicated.

SUMMARY OF THE INVENTION

It is therefore an object of the invention to provide a method of fabricating a via and an interconnection. Only one step of photolithography process is in use. Therefore, the process is simplified, the cost of fabrication is reduced, and the reliability of the devices is enhanced.

To achieve these objects and advantages, and in accordance with the purpose of the invention, as embodied and broadly described herein, the invention is directed towards a photo-mask. A photo-mask comprises a quartz glass substrate, on which a clear area, a grey area, and a dark area. formed over the quartz glass substrate. Incident light penetrates through the clear area completely, but only part of the incident light will go through the grey area since the other part of the incident light is absorbed by the grey area, On the other hand, incident light is blocked by the dark area completely.

To achieve these objects and advantages, and in accordance with the purpose of the invention, as embodied and broadly described herein, the invention is directed towards a method of fabricating a photo-mask. A quartz glass substrate is provided. A light absorbing layer is formed on the quartz glass substrate. A chromium thin film is formed and patterned on the light absorbing layer. The light absorbing layer is patterned to expose a part of the quartz glass substrate.

It is to be understood that both the foregoing general description and the following detailed description are exemplary and explanatory only and are not restrictive of the invention, as claimed.

DESCRIPTION OF THE PREFERRED EMBODIMENTS

Figure 1A:
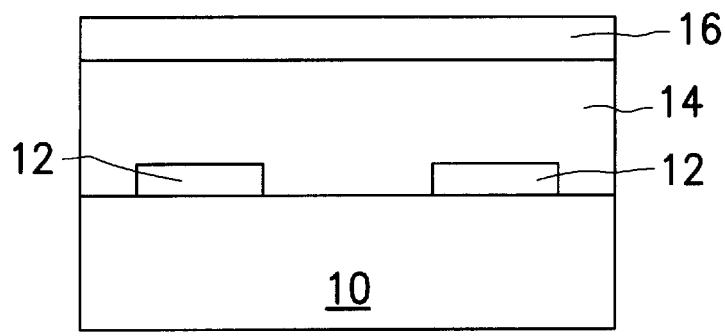
FIG. 1A to FIG. 1I are cross sectional views of a conventional process of damascence technique.
Figure 1B:
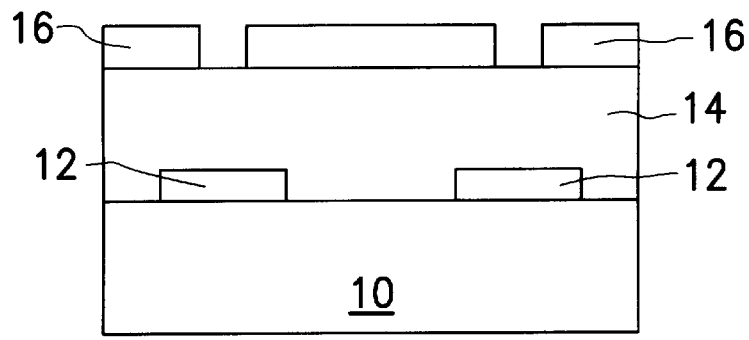
Figure 1C:
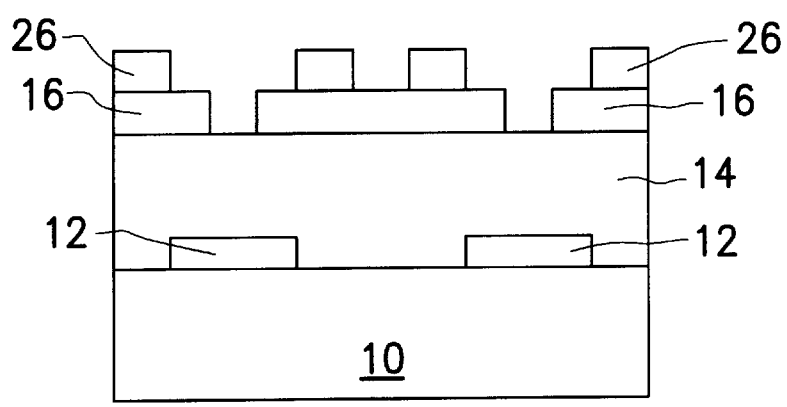
Figure 1D:
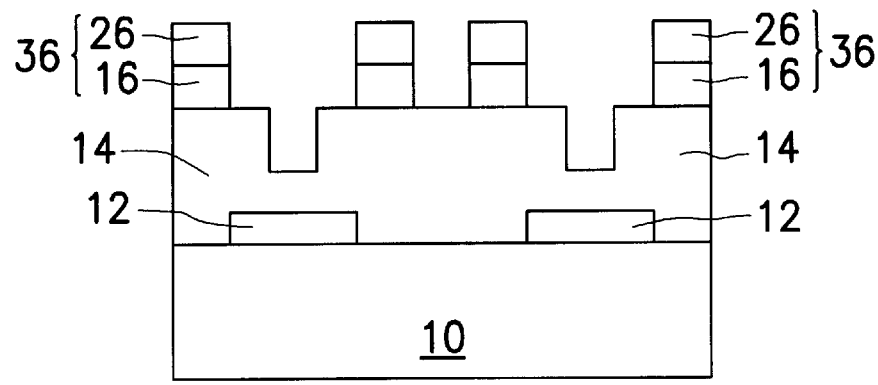
Figure 1E:
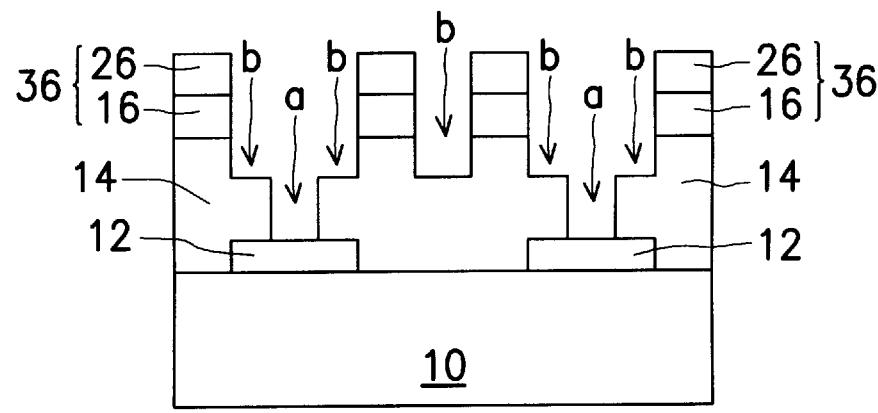
Figure 1F:
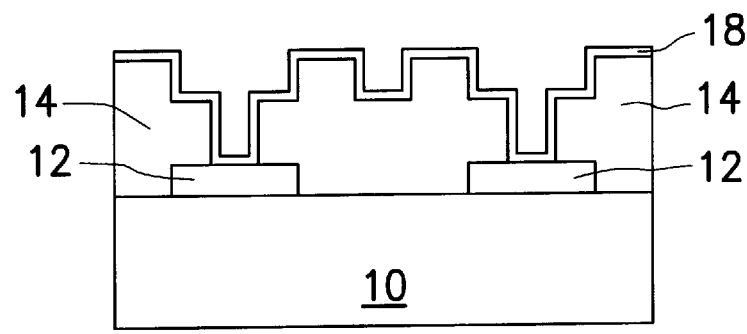
Figure 1G:
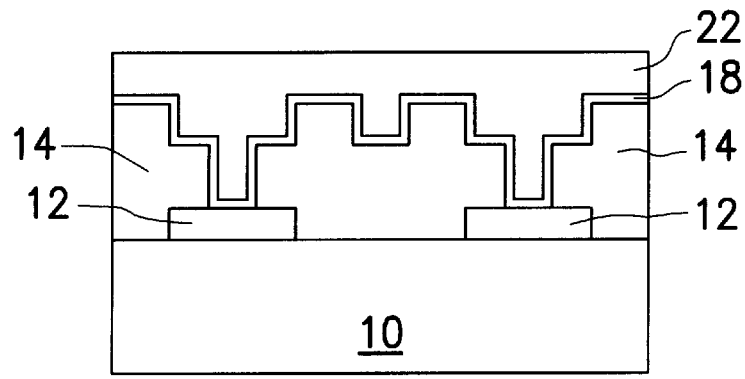
Figure 1H:
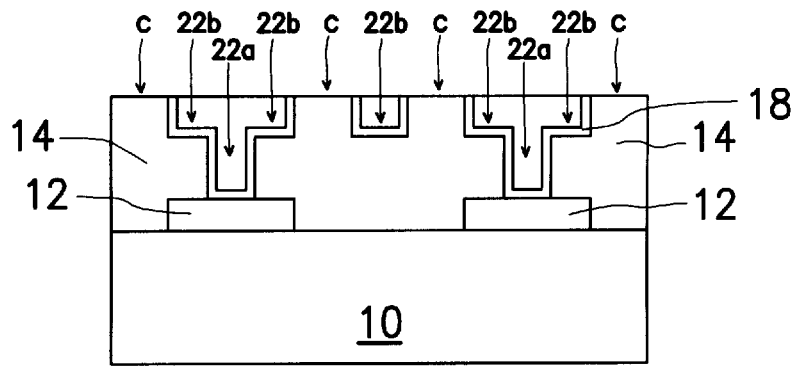
Figure 1I:
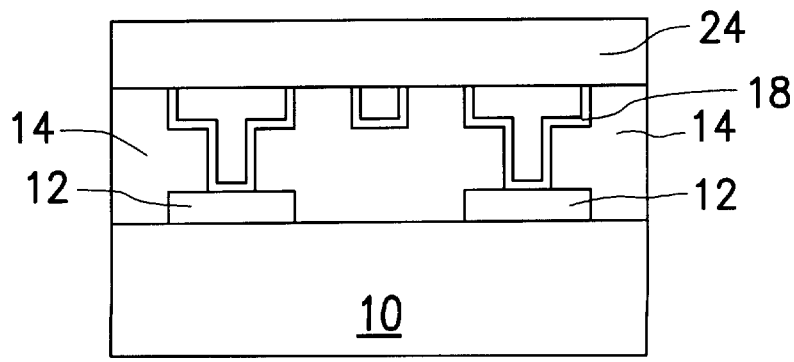
Figure 2A:
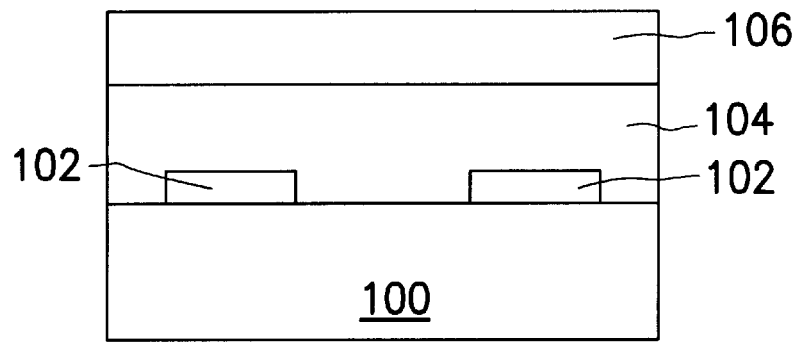
FIG. 2A to FIG. 2H are cross sectional views of the process of fabricating a via and an interconnection of a semiconductor device in a preferred embodiment according to the invention.

Referring to FIG. 2A, a first inter-metal dielectric layer 104 is formed on a semiconductor substrate 100 having a MOS device (not shown on the figure) and a first metal layer 102 formed thereon. A photo-resist layer 106 is formed on the first metal layer 102.

Figure 2B:
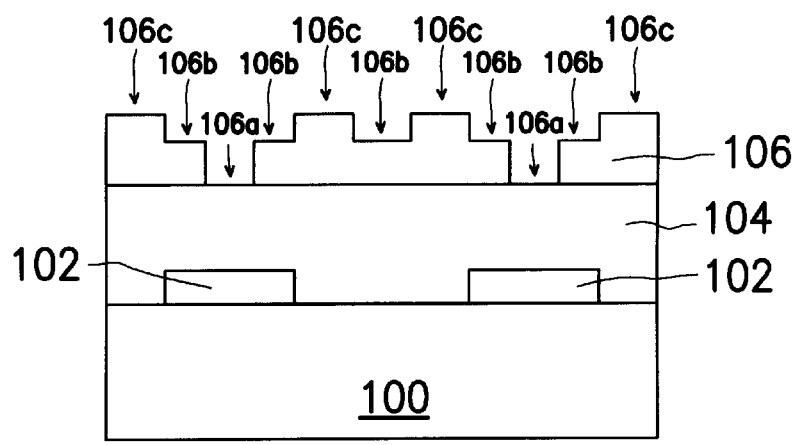

Referring to FIG. 2B, using a photo-mask and performing one step of photolithography, the photo-resist layer 106 is defined into three regions. a via hole region 106a, an interconnection window region 106b, and an isolation region 106c. Whereas, the via hole region 106a is a thoroughly developed region. That is, the photo-resist layer 106 within the via hole region 106a is removed thoroughly to expose the inter-metal dielectric layer 104. The interconnection window region 106b is a partly developed region, that is, only part of the photo-resist layer 106 within the interconnection window region 106b is removed. The isolation region 106c is a completely undeveloped region. The photo-resist layer 106 within the isolation region 106c is not removed at all. Since only one step of photolithography is performed, only one photo-resist layer is formed. The process is simplified.

Figure 2C:
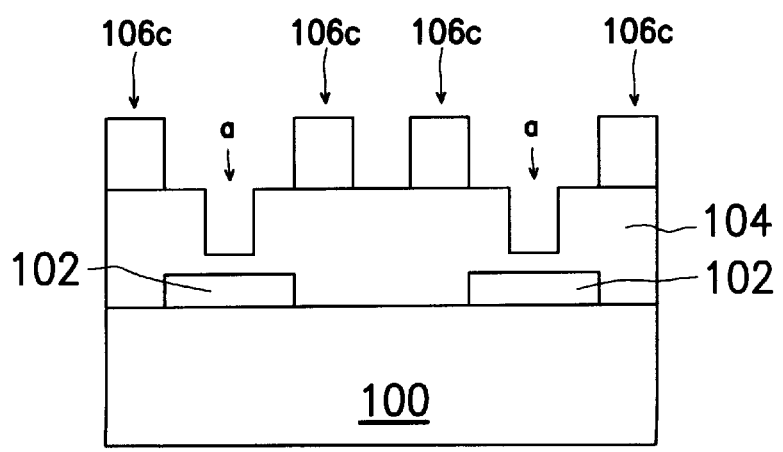

Referring to FIG. 2C, using the photo-resist layer 106 as a mask, a dry etching process is performed towards the first inter-metal dielectric layer 104 to form a prototype of a via hole a. At the same time, using photo-resist 106c as a mask, the photo-resist layer 106b is etched until the inter-metal dielectric layer 104 is exposed.

Figure 2D:
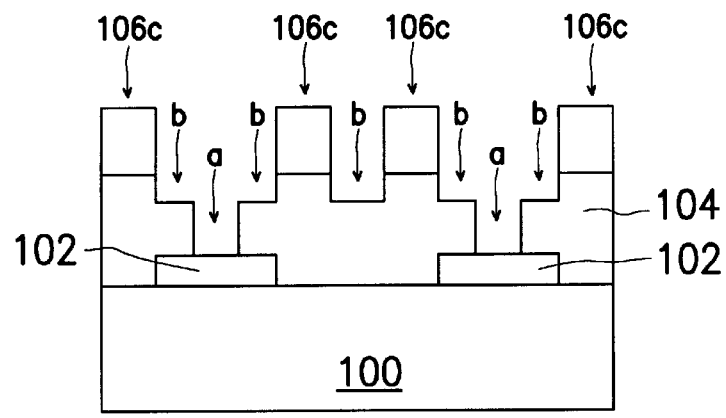

Referring to FIG. 2D, using the remaining photo-resist 106, that is, the isolation region 106c as a mask, a dry etching process is performed. A via hole a and an interconnection window b are formed to expose the first metal layer 102.

Figure 2E:
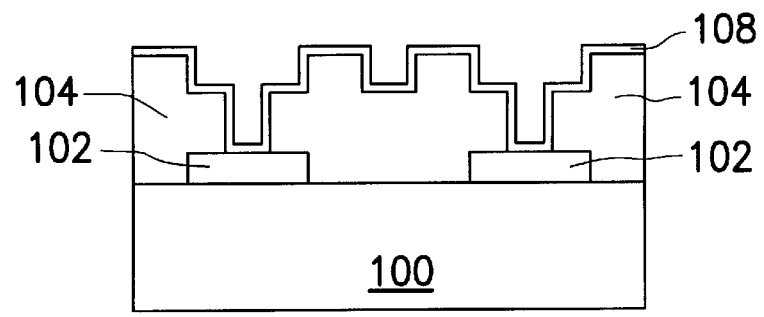

Referring to FIG. 2E, after removing the photo-resist layer 106, a thin barrier layer 108 conformal to the first inter-metal dielectric layer 104 is formed. The adhesion between the metal layer formed subsequently and other materials are thus enhanced.

Figure 2F:
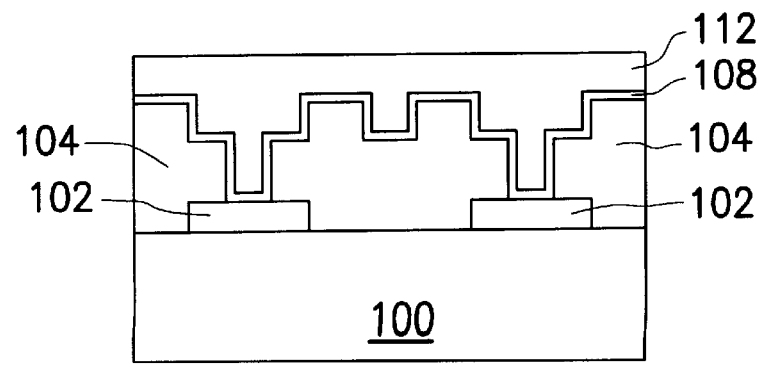
Figure 2G:
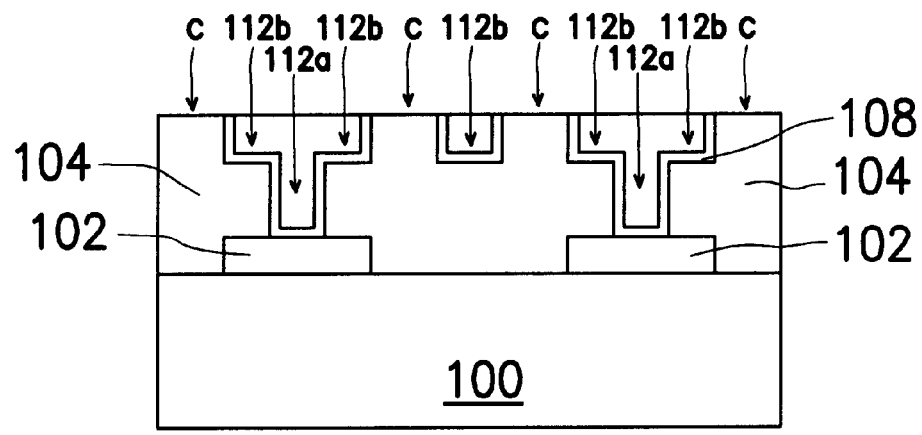
Figure 2H:
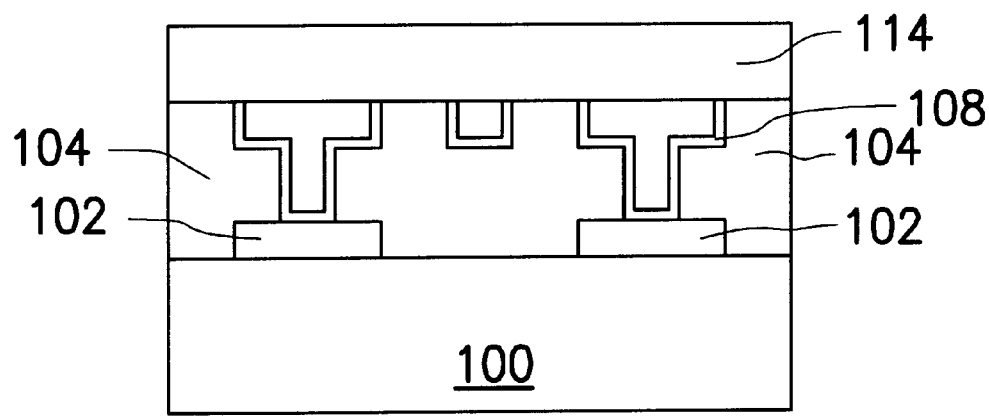

Referring to FIG. 2F, a second metal layer 112 is formed on the barrier layer 108 and fills the via hole a and the interconnection window b (as shown on FIG. 2D). An etching process, such as a CMP process, is performed until the first inter-metal dielectric layer 104 in isolation region c is exposed, and a via plug 112a and an interconnection 112b are formed as shown on FIG. 2H. A second inter-metal dielectric layer 114 is formed over the substrate 100. Repeating steps shown from FIG. 2A to FIG. 2G, another level of interconnections are formed.

Figure 3A:
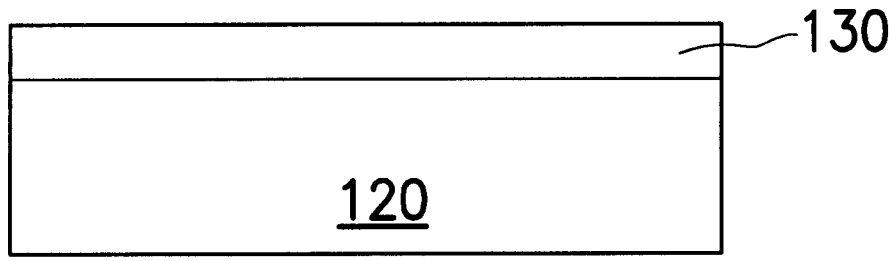
FIG. 3A to FIG. 3D show a method of fabricating a photo-mask in a preferred embodiment according to the invention.
Figure 3B:
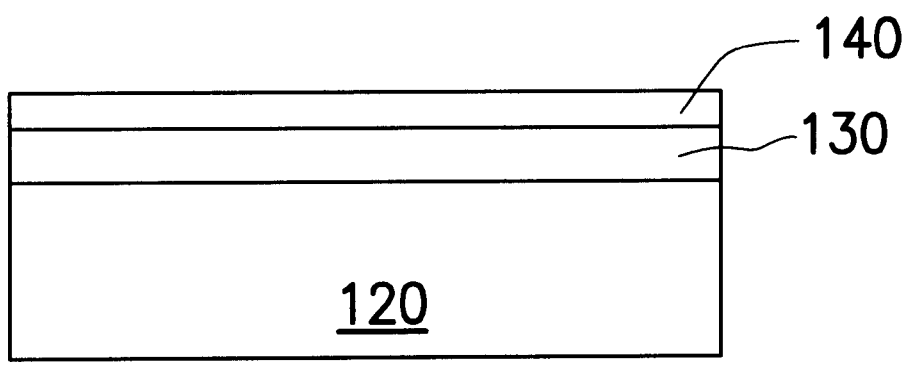
Figure 3C:
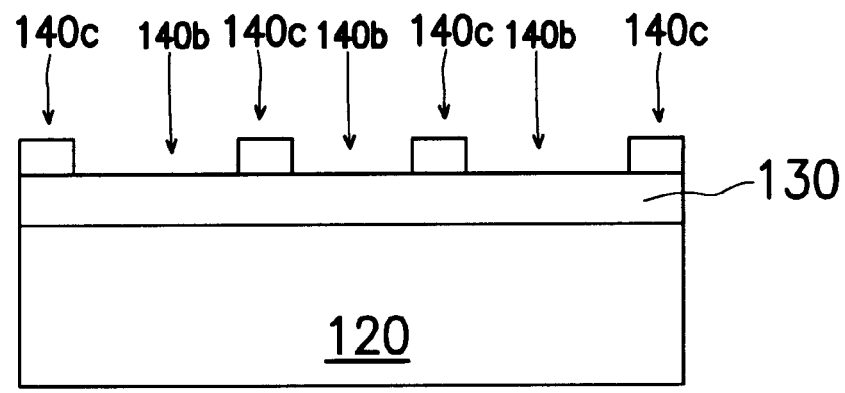
Figure 3D:
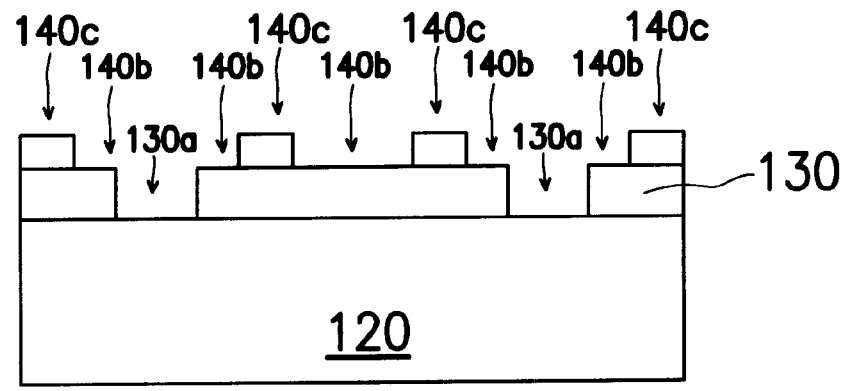

The photo-mask used in the invention to divide the photo-resist layer into three different regions (thoroughly developed, partly developed, and completely undeveloped regions) is different from a conventional photo-mask, which divides the photo-resist layer into two regions (thoroughly developed and completely undeveloped regions) only. During the photolithography process, a deep ultra-violet (UV) light is used as the light source. In the invention, a layer of deep UV-light absorbing material is formed on a conventional photo-mask, and a chromium thin film is subsequently formed on the layer of deep UV-light absorbing material. Therefore, a via and an interconnection can be formed in one single step of photolithography process. FIG. 3A to FIG. 3C show the method of fabricating a photomask according to the invention.

Referring to FIG. 3A, on a quartz glass substrate 120, a deep UV light absorbing layer 130, such as an amorphous silicon layer, having a thickness of hundreds of angstroms is formed. Referring to FIG. 3B, a chromium thin film 140 is formed on the amorphous silicon layer. The chromium thin film 140 is defined to form a grey area 140b by photolithography and etching. The remaining chromium thin film 140c on the amorphous silicon layer 130 is a dark area 140c. Since light cannot penetrate through at all, the dark area 140c is used to form an isolation region in the process of forming a via hole and an interconnection (the isolation area 106c shown on FIG. 2B). On the other hand, the absorption coefficient is in the range of 2.0 to 3.5. Thus, the light source cannot penetrate through completely, that is, part of the light is absorbed by the amorphous silicon. Therefore, the grey region 140b on which the chromium thin film 140 is removed is used to form an interconnection window region in the process of forming a via and an interconnection (the isolation area 106b shown on FIG. 2B). Using another step of photolithography and etching, the amorphous silicon layer 130 is defined to form a clear region 130a. Since both the chromium thin film and the amorphous silicon layer are removed from the clear region 130a, light can penetrate through completely. Thus, the clear region 130a is used to form a via hole region in the process of forming a via and an interconnection (the isolation area 106a shown on FIG. 2B).

In addition, amorphous silicon has a high etch resistance towards the etchant of chromium, and a strong adhesion to both chromium and quartz glass. Both characteristics are advantageous to the formation of the grey area. Moreover, chromium is deposited at a temperature as low as about 350° C. The quartz glass is not softened at such a low deposition temperature.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photo-mask, comprising:
a quartz glass substrate;
a clear area, formed on the quartz glass substrate;
a grey area, formed on the quartz glass substrate; and
a dark area, formed on the quartz glass substrate;
wherein the grey area comprises a deep UV-light-absorbing amorphous silicon layer formed on the quartz glass substrate, through which incident light is partly transmitted and is partly absorbed, and wherein the dark area comprises light-blocking chromium film.

2. The photo-mask according to claim 1, wherein the quartz glass substrate is exposed in the clear area through which the incident light penetrates completely.

3. The photo-mask according to claim 1, wherein the amorphous silicon layer is formed by plasma enhanced chemical vapour deposition at a temperature about 350° C.

4. A photo-mask, comprising:
a quartz glass substrate;
a patterned amorphous silicon layer that only partially transmits light and which covers only a part of the quartz glass substrate, so that a remaining part of the quartz glass substrate is exposed; and
a patterned chromium thin film, covering only a part of the patterned amorphous silicon layer, so that a remaining part of the patterned amorphous silicon layer is exposed.

5. The photo-mask according to claim 4, wherein the amorphous silicon layer is formed by plasma enhanced chemical vapour deposition at a temperature about 350° C.

6. The photo-mask according to claim 4, wherein the exposed remaining part of the quartz glass substrate is a clear area, through which incident light penetrates completely.

7. The photo-mask according to claim 4, wherein the patterned chromium thin film and the patterned amorphous silicon layer form a dark area which blocks incident light.

* * * * *